United States Patent

[11] 3,615,476

[72] Inventors Paul Maria Cassiers Mortsel-Antwerpen; Andre Jan Conix, Antwerpen; Gerard Albert Delzenne, Wilrijk-Antwerpen, all of Belgium

[21] Appl. No. 876,163
[22] Filed Dec. 4, 1969
[45] Patented Oct. 26, 1971
[73] Assignee Gevaert-AGFA N.V. Mortsel, Belgium
[32] Priority June 1, 1965
[33] Great Britain
[31] 23,394/65
Continuation of application Ser. No. 553,716, May 31, 1966, now abandoned.

[54] METHOD FOR RECORDING AND REPRODUCING INFORMATION BY SURFACE DEFORMATION OF A POLYMERIC COMPOSITION

7 Claims, No Drawings

[52] U.S. Cl. 96/49, 96/35.1, 96/27 R, 96/115 R
[51] Int. Cl. G03c 1/70
[50] Field of Search 96/35.1, 27, 115, 49

[56] References Cited

UNITED STATES PATENTS

| | | | |
|---|---|---|---|
| 1,547,466 | 7/1927 | Renck | 96/35 |
| 1,954,325 | 4/1934 | Martinez | 96/35 |
| 2,709,654 | 5/1955 | Guth | 96/35 |
| 2,948,610 | 8/1960 | Merrill et al. | 96/33 |
| 3,278,305 | 10/1966 | Laridon et al. | 96/35.1 |
| 3,298,833 | 1/1967 | Gaynor | 96/27 |
| 3,350,205 | 10/1967 | Goffe | 96/35.1 |

*Primary Examiner*—Ronald H. Smith
*Attorneys*—Robert F. Conrad and Alfred W. Breiner

ABSTRACT: A process is described for recording and reproducing information comprising the steps of imagewise exposing a recording layer comprising a polymeric composition which is photochemically hardenable to actinic light and treating the exposed layer with heat and/or a vapor containing a solvent for said polymeric composition during which treatment the polymeric composition is softened but without removal of any substantial part of the treated element. Upon allowing the treated layer to cool and/or absorbed solvent to volatilize a direct visual image in the light exposed portion of the layer is obtained as a result of the light scattering property in the irradiated portions. The resultant recording layer can be used in a manner similar to conventional photoresists, printing plates and the like.

METHOD FOR RECORDING AND REPRODUCING INFORMATION BY SURFACE DEFORMATION OF A POLYMERIC COMPOSITION

This is a continuation of application Ser. No. 553,716, filed May 31, 1966, now abandoned.

The present invention relates to a process for recording and reproducing information by means of a polymeric composition which can be photochemically hardened.

Many polymeric compositions for recording layers that have the property of becoming less soluble when exposed to actinic radiation are already known. Recording layers containing such compositions, after imagewise exposure to actinic light, are e.g., used to produce a photoresist, a printing plate or a relief reproduction of the original on a receiving element. For reproducing a photoresist the exposed recording layer is normally treated with a solvent for removing the unexposed and nonhardened portions of the layer. For producing a relief reproduction on a receiving element the exposed recording layer, occasionally while heating and/or occasionally in the presence of a solvent, is pressed against a receiving element e.g., a porous layer or sheet and peeled apart therefrom leaving on the receiving element an imagewise stratum of unhardened material of the recording layer.

Now it has been found that where use is made of a recording element, (a recording layer or sheet), wholly or mainly consisting of a polymeric composition, which can be photochemically hardened, a directly visible or by light detectable reproduction of an electromagnetic radiation image can be obtained by subjecting the recording element, after imagewise exposure to actinic electromagnetic radiation, to a heat and/or vapor treatment, which vapor contains a solvent or solvents for the said polymeric compositions and during which treatment softening of said composition takes place without removal of any or any a substantial part of the thus treated element, and subsequently allowing said element to cool and/or the absorbed solvent to volatilize.

In said type of reproduction the recording element (sheet or layer) is wrinkled on the irradiated areas and thus becomes imagewise opalescent by light-scattering.

The ripple image produced according to the reproduction method of the present invention cannot be erased by a prolonged heating as in the case in the thermoplastic recording system described by W. E. Glenn in J. Appl. Phys., Vol. 30, Dec. 1959, p. 1870, the photoconductive thermoplastic recording system described in the United Kingdom Pat. Specification 964,881, and the thermoplastic recording system described by F. H. Nicoll in RCA Review, June 1964, p. 217, since a permanent hardening on the exposed areas by cross-linking of the polymeric composition is produced.

Photo-cross-linking polymers and mixtures thereof showing after exposure to actinic radiation a difference in solubility, swelling and/or thermal expansion degree between portions irradiated with actinic light and nonirradiated portions are in principle all suitable for the recording and reproducing technique of the present invention. One skilled in the art has only to carry out a simple test to see if a particular polymeric system will be sensitive enough to produce the effect of wrinkling after exposure by the heat and/or vapor treatment.

The surface deformation or wrinkling of the exposed recording element is the more distinct the thinner the recording layers or sheets are. For obtaining suitable results by the thermal and/or vapor treatment the thickness of the recording layer coated on a support e.g., a flexible resin base, a glass or metal sheet is preferably from 1 to 20 $\mu$; the thickness of a self-supporting sheet, dependent on the desired mechanical strength, is preferably from 10 to 200 $\mu$.

The photochemically hardenable recording element suitable for use according to the method of the present invention preferably consists entirely or for more than 90 percent by weight of a photochemically hardenable polymer or a mixture of such polymers.

As photochemically hardenable polymers or polymer systems are preferably used those that have a softening point comprised between 50° and 200° C. and that have a good solubility in noninflammable solvents such as halogenated hydrocarbons.

Photochemically hardenable water insoluble polymers that are preferably used, e.g., resins containing aromatic azide groups and/or carboxylic acid azide groups and/or sulfonic acid azide groups, are described in the Belgian Pat. Specifications 650,367, 665,428 and 656,511 which specifications have to be read in conjunction herewith.

The photochemically hardenable recording element may in addition to the photochemically hardenable polymers also contain substances which increase their sensitivity to light.

Further the recording element may contain, stabilizing agents, plasticizers, catalysts for the hardening reaction, pigments, substances having a different refractive index from that of the said hardenable polymers, dyes and the like.

It has been observed that when carrying out the heat and/or vapor treatment after exposure of the recording element through a line screen said recording element is deformed in accordance with the screen pattern more particularly in such a way that the linewise exposed areas project above the linewise nonexposed areas. On the projecting exposed areas a microdeformation (microripples) is visible. The formation of these microripples is favored by closely and slightly scratching the surface of the recording element or by dispersing in the recording layer a finely divided substance. By the arising light scattering the formed ripple pattern is directly visible and the rippled areas are viewed as shadow areas when a light beam is projected through the recording element.

The following examples illustrate the present invention without limiting it, however, thereto.

EXAMPLE 1

A solution of 50 g. of an arylazido polycondensate, which is built up by the following structural units:

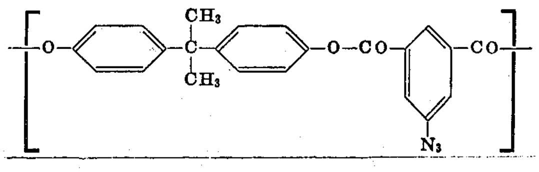

and which is prepared as described in example 1 C of the Belgian Pat. Specification 656,511, in a mixture of 400 cc. of methylene chloride and 100 cc. of sym.-tetrachloroethane is coated on a glass plate in such a way that after drying a layer of 125 $\mu$ thickness is obtained. After drying the said layer is peeled off from the glass plate and a self-supporting sheet is obtained. The said sheet is exposed for 13 minutes in contact with a line screen having 5 linear apertures per running cm. by means of a Philips HP 80 Watt lamp placed at a distance of 60 cm. from the light-sensitive material. After the exposure the recording sheet is treated for 5 minutes, with trichloroethylene vapor. After this treatment the recording sheet shows a permanent deformation in accordance with the screen pattern, said deformation being such that the exposed areas clearly project above the unexposed areas. On these elevations a microrippling at random is visible. Little scratches at the surface of the recording sheet, which are not visible with the naked eye on the unexposed areas, are clearly visible on the exposed areas.

When a directed light beam shines through the self-supporting recording sheet the exposed areas are visible as a shadow image owing to their light scattering power.

When treating the exposed recording sheet with toluene vapors for 5 minutes, an analogous result is obtained, however, with slightly less relief formation.

When the exposed self-supporting sheet is heated for 2 minutes, at 200° C. on a Kofler hot bench instead of subjecting it to one of the above treatments with solvents an analogous direct visible light scattering image is also obtained.

EXAMPLE 2

A self-supporting sheet of 100 $\mu$ thickness having a slightly mat aspect is prepared, from a solution of 50 g. of the arylazido polycondensate described in example 1 and 5 g. of Michler's ketone in a mixture of 400 cc. of methylene chloride and 100 cc. of sym.-tetrachloroethane.

The said sheet is exposed as described in example 1 the exposure time, however, being 4 minutes.

By treating the exposed sheet for 5 minutes, with trichloroethylene vapors the unexposed areas become completely clear and the mat aspect of the exposed areas is intensified. By an enlargement of 200 times under a microscope a microrippling at random is clearly visible in the exposed areas. A shadow pattern in conformity with the exposed areas is produced by projecting a light beam through the vapor-treated sheet.

It is claimed:

1. The process for recording and reproducing information comprising the steps of (1) imagewise exposing to actinic light a layer or sheet consisting essentially of a polymer having azide groups which can be photochemically hardened; (2) uniformly treating the resultant layer or sheet with heat and/or a vapor containing a solvent for said polymer for a time sufficient to soften said polymer without removal of any substantial part of said layer or sheet; and (3) allowing said treated layer or sheet to cool and/or absorbed solvent to volatilize thereby obtaining a permanent deformation in accordance with the imagewise exposure on the exposed areas with the unexposed areas remaining undeformed.

2. A process according to claim 1 wherein the said layer or sheet is composed primarily of a polymer containing aromatic azide groups and/or carboxylic acid azide groups and/or sulfonic acid azide groups.

3. A process according to claim 1 wherein said layer or sheet has a thickness of from 1 to 20 $\mu$.

4. A process according to claim 1 wherein said layer or sheet has a thickness of from 1 to 200 $\mu$.

5. A process according to claim 1 wherein the said layer or sheet contains a substance increasing the light sensitivity of the photochemically hardenable polymeric composition.

6. A process according to claim 5 wherein the said substance is Michler's ketone.

7. A process according to claim 1 wherein the said layer or sheet is composed primarily of photochemically hardenable polymer containing carboxylic acid azide groups and the said layer or sheet after exposure is treated with trichloroethylene vapor.